US006621305B2

(12) United States Patent
Nakagawa et al.

(10) Patent No.: US 6,621,305 B2
(45) Date of Patent: Sep. 16, 2003

(54) PARTIAL SWING LOW POWER CMOS LOGIC CIRCUITS

(75) Inventors: Osamu Samuel Nakagawa, Redwood City, CA (US); Norman Chang, Fremont, CA (US); Shen Lin, Foster City, CA (US); Weize Xie, Cupertino, CA (US); Kenynmyung Lee, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 34 days.

(21) Appl. No.: 09/920,886

(22) Filed: Aug. 3, 2001

(65) Prior Publication Data

US 2003/0030467 A1 Feb. 13, 2003

(51) Int. Cl.[7] .................. H03K 19/096; H03K 19/0948
(52) U.S. Cl. .......................................... 326/98; 326/121
(58) Field of Search .............................. 326/95, 96, 97, 326/98, 83, 121

(56) References Cited

U.S. PATENT DOCUMENTS 3,601,627 A  *  8/1971  Booher ...................... 307/205
5,831,451 A  * 11/1998  Bosshart ...................... 326/93
6,104,213 A  *  8/2000  Dhong et al. .................. 326/98
6,204,696 B1 *  3/2001  Krishnamurthy et al. ..... 326/98
6,346,831 B1 *  2/2002  Krishnamurthy et al. ..... 326/98

OTHER PUBLICATIONS

Yuan et al. "High–Speed CMOS Circuit Technique", Feb. 1989, IEEE Journal of Solid–State Circuits, vol. 24, No. 1, pp. 62–70.*

* cited by examiner

Primary Examiner—Daniel Chang

(57) ABSTRACT

A logic gate circuit and related methods and apparatus exhibit reduced voltage swing and thereby consume less power. The circuit is connected to a plurality of input signals and a clock signal. The circuit produces an output. The circuit comprises a node, a pull-down network and an N-type MOS transistor. The pull-down network is connected to the node, a first reference voltage, the plurality of inputs and the clock signal. The N-type MOS transistor is connected between the node and a second reference voltage. The N-type MOS transistor is also connected to a complement of the clock signal. A method of the invention accepts a complement of a clock signal and pre-charges a node to a voltage less than a power supply voltage, in response to the complement of the clock signal. The method also accepts a plurality of input signals and accepts the clock signal. The method conditionally discharges the node, in response to the clock signal, on the basis of the plurality of input signals.

17 Claims, 2 Drawing Sheets

PARTIAL SWING LOW POWER CMOS LOGIC CIRCUITS

FIELD OF THE INVENTION

This invention relates generally to logic circuitry, and more particularly to CMOS (complementary metal oxide semiconductor) logic circuits.

BACKGROUND OF THE INVENTION

FIG. 1 is a schematic diagram of a conventional CMOS logic circuit 100. The circuit 100 performs a two-input logical AND function. The inputs to the circuit 100 are two logic signals A and B, as well as a clock signal (p; the output is a signal C. The signal C is the logical AND of the signals A and B. That is, the signal C is high only if both signals A and B are high.

The circuit 100 comprises several transistors 110–170, which are field effect transistors (FETs) of the CMOS type, i.e., MOSFETs. Each transistor is either a PMOS (P-type metal oxide semiconductor) transistor, such as the transistor 110, or an NMOS (N-type metal oxide semiconductor) transistor, such as the transistor 120. Each transistor has three terminals: a drain (depicted as the top terminal, as shown in FIG. 1); a source (depicted on the bottom, as shown in FIG. 1); and a gate (depicted on the side, as shown in FIG. 1). The schematic symbol for a P-type transistor includes a circle at the gate terminal, whereas no such circle is part of the N-type transistor schematic symbol. An NMOS transistor "turns on" or has low resistance between its drain and source terminals when a high voltage (higher than a threshold voltage, $V_{TH}$) is applied to its gate. A PMOS transistor turns on when a low voltage is applied to its gate.

The circuit 100 operates as follows: During the low half cycle of the periodic clock signal ϕ, when the clock signal ϕ is low, the transistor 110 turns on, causing a node X to charge to a voltage $V_{DD}$. This is a pre-charging phase. When the clock signal ϕ goes high, the transistor 110 turns off and the transistor 120 turns on. This is an evaluation interval. If, during this time, the signals A and B are both high, then the transistors 130 and 140 both turn on, forming a path from the node X to ground, causing the node X to discharge to ground potential. If either the signal A or the signal B is low, then the node X remains at the voltage $V_{DD}$.

The transistors 150 and 160 are arranged as an inverter. If the node X is high (i.e., $V_{DD}$), then the transistor 150 is off while the transistor 160 is on, causing the node C to be low. If the node X is low (i.e., ground), then the transistor 150 is on while the transistor 160 is off, causing the node C to be high. Thus, the node C is the opposite of the node X.

The transistor 170 is a "keeper" transistor, connected in a feedback arrangement. When the node C is low, the transistor 170 is on, connecting the node X to $V_{DD}$, thus maintaining (or "keeping") the node X in a high state until A and B go high, despite any slow leakage that may occur across the transistors 120, 130 and 140. The transistor 170 is very small, such that, when the node X is driven low by the transistors 120, 130 and 140 being on during an evaluation phase, the effect of the transistor 170 is overcome, pulling the node X low.

Although the circuit 100 illustrates a two-input AND gate, other logical functions can be easily implemented by slightly modifying the circuit 100. The transistors 120, 130 and 140 form a pull-down network that discharges the node X to ground potential during the evaluation interval depending upon the voltages at the signals A and B. Because the transistors 130 and 140 are arranged in series, a two-input AND function is performed. If a greater number of transistors are connected in series, then three-input or greater AND gate can be implemented. If the transistors 130 and 140 were connected is parallel instead, then the circuit 100 would be an OR gate. For any reasonable number of transistors in any hybrid series-parallel arrangement between the node X and the transistor 120, any hybrid AND-OR function can be implemented.

The power consumption of the circuit 100 is composed of three parts: switching power, short circuit power and leakage power. Switching power is the dominant portion and is given by the following formula:

$$P = fCV_{DD}V_{SW}/2, \quad\quad\quad (Eqn.1)$$

where f is the frequency of the clock ϕ, C is the capacitive load driven by the gate, and $V_{SW}$ is the voltage swing. In FIG. 1, $V_{SW}=V_{DD}$, because the node X swings between $V_{DD}$ (during the pre-charging phase) and zero (during the evaluation interval when the signals A and B are high).

One technique for decreasing power consumption is to lower the clock frequency f. However, this approach limits performance and is therefore undesirable. Rather than decreasing clock frequency and performance, there is a strong trend in the industry to increase performance and clock speeds. At the same time, there is a strong trend favoring smaller devices, including mobile devices, that are battery powered and consume limited power.

SUMMARY OF THE INVENTION

In one respect, the invention is a logic gate circuit. The circuit is connected to a plurality of input signals and a clock signal. The circuit produces an output. The circuit comprises a node, a pull-down network and a N-type MOS transistor. The pull-down network is connected to the node, a first reference voltage, the plurality of inputs and the clock signal. The N-type MOS transistor is connected between the node and a second reference voltage. The N-type MOS transistor is also connected to a complement of the clock signal.

In another respect, the invention is a method. The method accepts a complement of a clock signal and pre-charges a node to a voltage less than a power supply voltage, in response to the complement of the clock signal. The method also accepts a plurality of input signals and accepts the clock signal. The method conditionally discharges the node, in response to the clock signal, on the basis of the plurality of input signals.

In yet another respect, the invention is an apparatus. The apparatus comprises a means for accepting a complement of a clock signal and pre-charging a node to a voltage less than a power supply voltage, in response to the complement of the clock signal. The apparatus also comprises a means for accepting a plurality of input signals, accepting the clock signal and conditionally discharging the node, in response to the clock signal, on the basis of the plurality of input signals.

In comparison to known prior art, certain embodiments of the invention are capable of achieving certain advantages, including some or all of the following: (1) power consumption can be decreased without decreasing clock frequency; (2) the power savings is greater for high frequencies; and (3) the timing performance is also improved. Those skilled in the art will appreciate these and other advantages and benefits of various embodiments of the invention upon reading the following detailed description of a preferred embodiment with reference to the below-listed drawings.

DETAILED DESCRIPTION OF A PREFERRED EMBODIMENT

Figure 1:
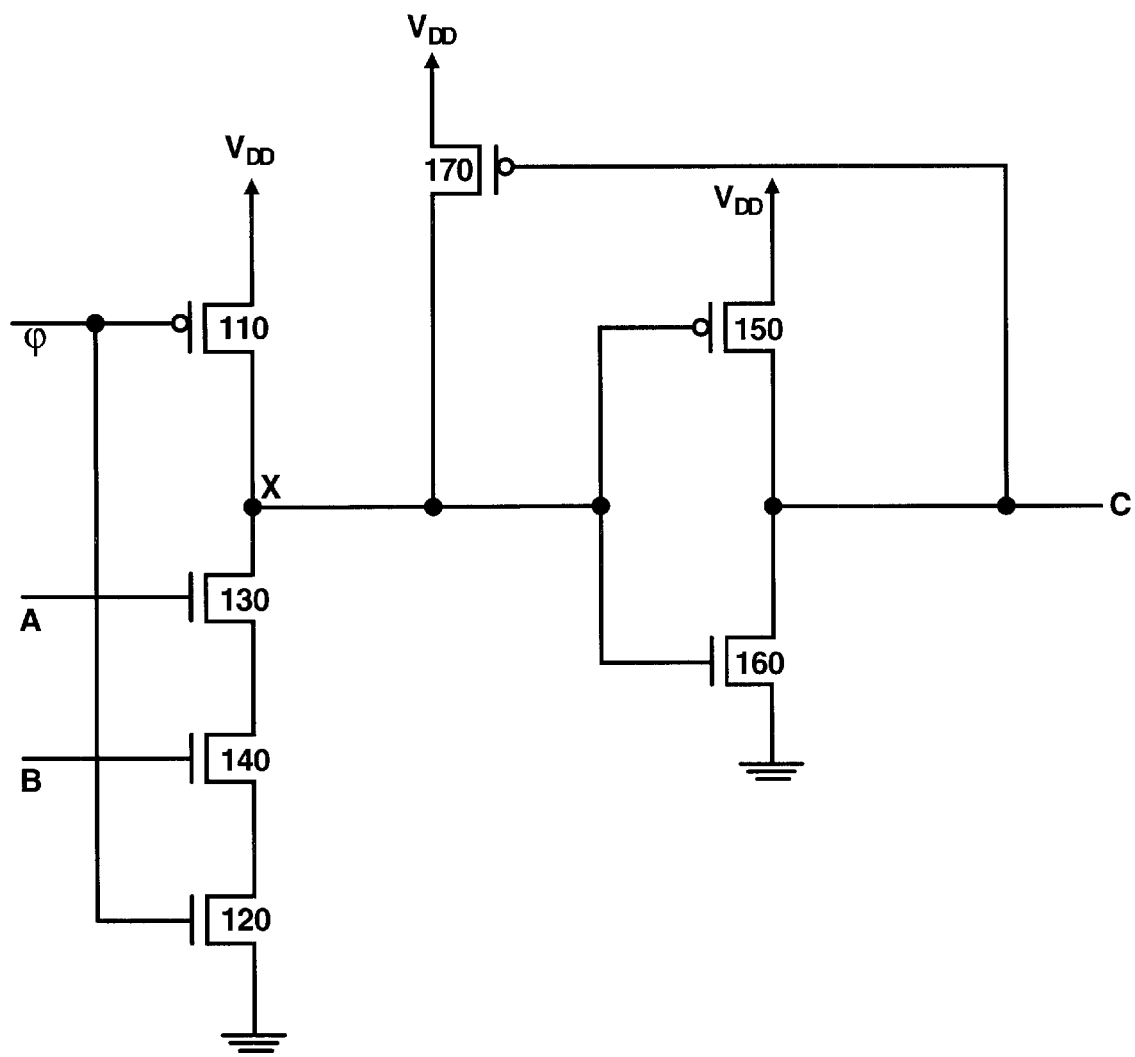
FIG. 1 is a schematic diagram of a conventional CMOS AND circuit.
Figure 2:
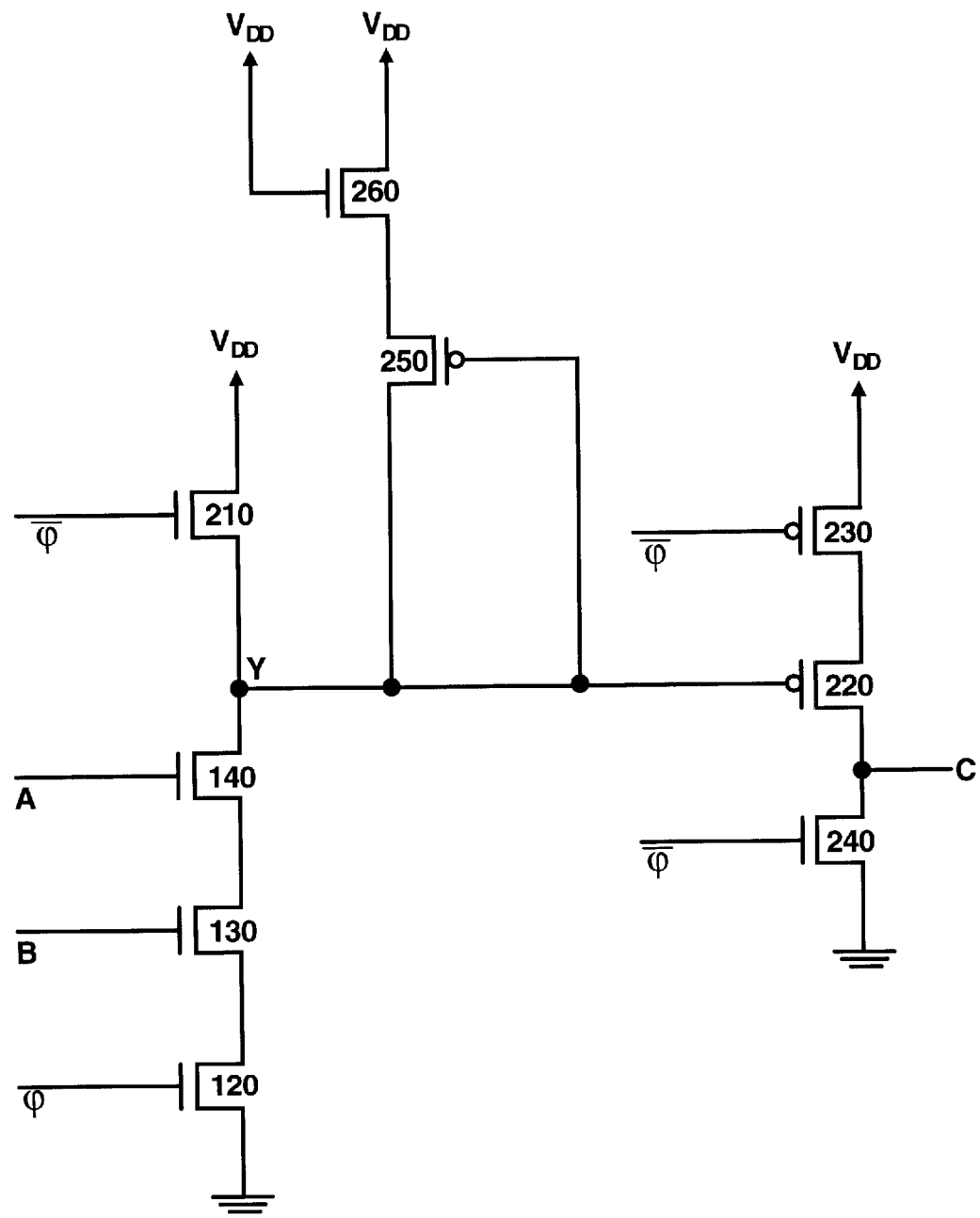
FIG. 2 is a schematic diagram of a CMOS AND circuit, according to an embodiment of the invention.

FIG. 2 is a schematic diagram of a CMOS AND circuit 200, according to an embodiment of the invention. Like the circuit 100, the circuit 200 comprises a pull-down network formed by the transistors 120, 130 and 140. During an evaluation interval when the clock signal $\phi$ is high, if the input signals A and B are high, then the pull-down network connects a node Y to ground.

However, the circuit 200 differs from the circuit 100 during the pre-charging phase. During the pre-charging interval, a complement clock signal $\bar{\phi}$ is high. The complement clock signal $\bar{\phi}$ is connected to the gate terminal of an NMOS transistor 210. When the complement clock signal $\bar{\phi}$ is high, the transistor 210 turns on, charging the node Y to a voltage $V_{SW}$. Because the transistor 210 is an NMOS transistor exhibiting a body effect, there is a voltage drop from source to drain on the transistor 210. Because of this voltage drop, $V_{SW}$ is less than $V_{DD}$ by an amount equal to the threshold voltage of the transistor 210. Mathematically stated, $V_{SW} = V_{DD} - V_{TH}$. As a typical example, $V_{SW} \approx 70\% V_{DD}$.

The node Y is connected to the gate of a PMOS transistor 220, which is connected in the middle of a stack of transistors connected in series from source to drain from VDD to ground. At the top of this stack is a PMOS transistor 230, whose drain is connected to VDD and whose gate is connected to the complement clock signal $\bar{\phi}$. At the bottom of the stack is an NMOS transistor 240, whose source is connected to ground and whose gate is also connected to the complement clock signal $\bar{\phi}$. An output signal C is connected to the node at the source of the transistor 220 and the drain of the transistor 240. During the pre-charging phase, the transistor 240 is on, connecting the output C to ground. During the evaluation phase, the transistor 230 is on. If the node Y is low during this time, then the transistor 220 is also on, in which case the output signal C goes high.

The transistors 250 and 260 assist in maintaining the proper voltage on the node Y. If the voltage at the node Y drops too low, such as might occur from unintended leakage current through the pull-down network composed of the transistors 120–140, then the transistor 250 turns on. The transistor 260 is always on and preferably has a threshold voltage approximately matched to that of the transistor 210. As a result, when the transistor 250 turns on, the node Y is charged back to $V_{SW}$ through the transistors 250 and 260. The transistor 250 is preferably very small, such that, when the node Y is driven low by the pull-down network, the effect of the transistor 250 is overcome, pulling the node Y low. Though optional, the transistors 250 and 260 are highly desirable to maintain the proper voltage on the node Y when current leakage is a concern.

To avoid having the transistor 220 partially on during the evaluation phase, the transistors 210 and 260 should have low thresholds. If the threshold voltage of the transistor 210 is too great, then an insufficient voltage would develop on the node Y to turn off the transistor 220. Although maximizing the threshold voltage minimizes voltage swing on the node Y and therefore minimizes power consumption, proper operation of the rest of the circuit, namely the transistor 220, sets a maximum limit on the threshold voltage. More specifically, the threshold voltage of the transistors 210 and 260 should be less than that of the transistor 220. In one preferred form, $V_{TH} \approx 0.25$ volts, whereas the threshold voltage is normally $V_{TH} = 0.35$ volts for the other transistors. The threshold voltage can be controlled during the manufacturing process of the circuit 200, according to techniques well-known in the art.

The node Y is a logical NAND of the input signals A and B. The transistors 220–240 are optional. The transistors 220–240, which invert the node Y as the output signal C, are necessary only to provide positive logic functions.

The circuit 200 illustrates a two-input AND circuit, but this is only for the sake of illustration. Other logic functions are possible. For example, the addition of more transistors like the transistors 130–140 in series with the transistors 120–140 results in an three or more input AND function. As another example, connecting the transistors 130 and 140 in parallel rather than in series results is an OR function. Any reasonable number of transistors can be arranged in any series-parallel configuration to provide any desired hybrid AND-OR function (or NAND-NOR function in the absence of the transistors 220–240).

The circuit 200 performs a method for processing the input signals A and B to produce a logical output. The method involves accepting the complement clock signal $\bar{\phi}$ and pre-charging the node Y to a voltage less than the power supply voltage $V_{DD}$, in response to the complement clock signal $\bar{\phi}$. These steps are performed by the transistor 210. The method also involves accepting the input signals A and B, as done by the transistors 130–140, and accepting the clock signal $\phi$, as done by the transistor 120. Finally, the method involves conditionally discharging the node Y, in response to the clock signal $\phi$, on the basis of the input signals A and B. If both A and B are high, then the node Y is discharged. Optionally, the method takes steps to maintain the voltage on the node Y, as done by the transistors 250 and 260, and/or produces the output signal C that is logically inverted with respect to the node Y. The inversion step is performed by the transistors 220–240. Those skilled in the art recognize that the specific structures illustrated in FIG. 2 are merely one set of means for performing these functions. Those skilled in the are would recognize other structures that are functionally equivalent.

The circuit 200 consumes considerably less power than the circuit 100. In SPICE™ simulations with a model for 0.18$\mu$ (microns or $10^{-6}$ meters) CMOS integrated circuits, assuming a capacitive load of 0.12 pF (picofarads), power was calculated by integrating the current flowing from the power supply $V_{DD}$. The results, as shown in Table A below, indicate a power savings of approximately 20%–25% across a range of clock frequencies.

TABLE A

| Clock period (1/f) | Power Reduction |
|---|---|
| 1.667 ns | 26.5% |
| 2.667 ns | 25.8% |
| 3.667 ns | 25.4% |
| 36.67 ns | 21.7% |

As can be seen from the tabulated results, the power savings is greatest for higher clock frequencies. This trend is consistent with equation (1).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A logic gate circuit connected to a plurality of input signals and a clock signal, the circuit producing an output, the circuit comprising:

a node;

a pull-down network connected to the node;

a first and second reference voltage;

a plurality of input signals;

the clock signal;

an N-type MOS transistor connected between the node and the second reference voltage, such that the gate of the N-type MOS transistor is connected to a complement of the clock signal;

a P-type MOS transistor whose drain and gate terminals are connected to the node; and a second N-type MOS transistor whose source is connected to the source of the P-type MOS transistor and whose drain and gate terminals are connected to the second reference voltage.

2. The circuit of claim 1 wherein the N-type MOS transistor has a threshold voltage less than other transistors in the circuit.

3. The circuit of claim 1 wherein the voltage on the node swings from approximately the first reference voltage to less than the second reference voltage.

4. The circuit of claim 3 wherein the voltage on the node swings from approximately the first reference voltage to less than the second reference voltage by an amount equal to a threshold voltage of the N-type MOS transistor.

5. The circuit of claim 1, further comprising:

a second P-type MOS transistor, wherein said second N-type MOS transistor, said P-type MOS transistor and said second P-type MOS transistor are connected in series from source to drain from the first reference voltage to the second reference voltage, and wherein a complement of the clock signal is connected to the gates of the second P-type MOS transistor and the second N-type MOS transistor.

6. The circuit of claim 1 wherein the second N-type MOS transistor has a threshold voltage less than normal.

7. The circuit of claim 1 wherein the first reference voltage is ground and the second reference voltage is a power supply voltage.

8. A method comprising:

accepting a complement of a clock signal;

pre-charging a node to a voltage less than a power supply voltage, in response to the complement of the clock signal;

accepting a plurality of input signals;

accepting the clock signal;

conditionally discharging the node, in response to the clock signal, on the basis of the plurality of input signals; and inverting a voltage with respect to the node, wherein said step of inverting is performed by a P-type MOS transistor whose drain and gate terminals are connected to the node and a N-type MOS transistor whose source is connected to the source of the P-type MOS transistor and whose drain and gate terminals are connected to a reference voltage.

9. The method of claim 8 wherein the pre-charging step comprises:

turning on a transistor when a voltage on the complement of a clock signal exceeds a threshold voltage, wherein the threshold voltage is less than normal.

10. The method of claim 8 further comprising:

producing a signal that is logically inverted with respect to the node.

11. The method of claim 10 wherein the producing step comprises:

turning on a transistor when a voltage on the node exceeds a threshold voltage, wherein the threshold voltage is less than normal.

12. An apparatus comprising:

a means for accepting a complement of a clock signal and pre-charging a node to a voltage less than a power supply voltage, in response to the complement of the clock signal;

a means for accepting a plurality of input signals, accepting the clock signal and conditionally discharging the node, in response to the clock signal, on the basis of the plurality of input signals; and a means for producing a voltage that is inverted from the node, said inverting means comprising a P-type MOS transistor whose drain and gate terminals are connected to the node and a N-type MOS transistor whose source is connected to the source of the P-type MOS transistor and whose drain and gate terminals are connected to a reference voltage.

13. The apparatus of claim 12 wherein the means for accepting a complement of a clock signal and pre-charging a node is an N-type MOS transistor.

14. The apparatus of claim 13 wherein the N-type MOS transistor has a threshold voltage less than normal.

15. The apparatus of claim 12 wherein the means for accepting a plurality of input signals, accepting the clock signal and conditionally discharging the node comprises a pull-down network.

16. The apparatus of claim 15 wherein the pull-down network comprises a plurality of N-type MOS transistors connected in series from source to drain from the node to ground, wherein each of the plurality of input signals and the clock signal is connected to a gate terminal of one of the plurality of N-type MOS transistors.

17. The apparatus of claim 12 further comprising:

a means for maintaining a voltage on the node in the presence of leakage current.

* * * * *